(12) United States Patent
Boos

(10) Patent No.: US 11,817,866 B2
(45) Date of Patent: *Nov. 14, 2023

(54) FREQUENCY GENERATION AND SYNCHRONIZATION SYSTEMS AND METHODS

(71) Applicant: Apple Inc., Cupertino, CA (US)

(72) Inventor: Zdravko Boos, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/949,265

(22) Filed: Sep. 21, 2022

(65) Prior Publication Data
US 2023/0098964 A1   Mar. 30, 2023

Related U.S. Application Data

(63) Continuation of application No. 17/268,204, filed as application No. PCT/US2019/053275 on Sep. 26, 2019, now Pat. No. 11,463,095.

(60) Provisional application No. 62/736,596, filed on Sep. 26, 2018.

(51) Int. Cl.
| | | |
|---|---|---|
| *H03L 7/099* | (2006.01) | |
| *G04F 10/00* | (2006.01) | |
| *G06F 1/04* | (2006.01) | |
| *H03K 17/687* | (2006.01) | |
| *H04L 7/033* | (2006.01) | |

(52) U.S. Cl.
CPC ............ *H03L 7/099* (2013.01); *G04F 10/005* (2013.01); *G06F 1/04* (2013.01); *H03K 17/687* (2013.01); *H04L 7/0331* (2013.01)

(58) Field of Classification Search
CPC ... H03L 7/099; H03L 7/06; H03L 7/08; H03L 7/18; H03B 5/02; H03B 5/12; H03B 5/1206; H03B 5/1253; G04F 10/005; H04L 7/0331; H04L 7/033
USPC ......... 375/376; 327/147, 156, 159, 162, 163
See application file for complete search history.

(56) References Cited

U.S. PATENT DOCUMENTS

| | | | |
|---|---|---|---|
| 6,404,247 B1 | 6/2002 | Wang | |
| 6,807,235 B2 | 10/2004 | Yano et al. | |
| 6,956,922 B2 | 10/2005 | Weldon et al. | |
| 7,808,327 B2 | 10/2010 | Feygin et al. | |
| 8,362,815 B2 | 1/2013 | Pavlovic et al. | |
| 9,356,606 B2 | 5/2016 | Caffee et al. | |
| 9,553,570 B1 | 1/2017 | Bal | |
| 11,463,095 B2 * | 10/2022 | Boos | H04L 7/0331 |

OTHER PUBLICATIONS

International Search Report dated Jan. 23, 2020 for International Application No. PCT/US2019/053275.

(Continued)

*Primary Examiner* — Hai L Nguyen
(74) *Attorney, Agent, or Firm* — Eschweiler & Potashnik, LLC

(57) ABSTRACT

A clock generator can include a Fin Field Effect Transistor (FinFET) oscillator and a phased-locked loop (PLL). The FinFET oscillator can generate a FinFET signal. The PLL can generate an output clock signal based on a reference clock signal and the FinFET signal.

20 Claims, 5 Drawing Sheets

(56) References Cited

OTHER PUBLICATIONS

Zographopoulos et al. "A 16-nm FinFET 16-GHz Differential LC-VCO" IEEE International Conference on Microwaves, Communications, Antennas and Electronic Systems (COMCAS 2015), Nov. 2-4, 2015, Tel Aviv, Israel.

Laha et al. "Radio Frequency IC Design with Nanoscale DGMOSFETs" Intech Open, published in 2013.

International Preliminary Report on Patentability dated Mar. 23, 2021 in connection with PCT Patent Application No. PCT/US2019/053275.

Non-Final Office Action dated Feb. 9, 2022 in connection with U.S. Appl. No. 17/268,204.

Notice of Allowance dated Jun. 2, 2022 in connection with U.S. Appl. No. 17/268,204.

* cited by examiner

FREQUENCY GENERATION AND SYNCHRONIZATION SYSTEMS AND METHODS

CROSS REFERENCE TO RELATED APPLICATIONS

This application is a continuation of U.S. application Ser. No. 11/268,204 filed Feb. 12, 2021, now U.S. Pat. No. 11,463,095 B2 issued on Oct. 4, 2022, which is a National Phase entry application of International Patent Application No. PCT/US2019/053275 filed Sep. 26, 2019, which claims priority to U.S. Provisional Patent Application No. 62/736,596, filed Sep. 26, 2018, entitled "Frequency Generation and Synchronization Systems and Methods," and is hereby incorporated by reference in its entirety.

FIELD

Aspects described herein generally relate to methods and systems for clock generation, including clock generation systems and methods including one or more FinFETs in a closed look configuration.

RELATED ART

Wireless communications are expanding into communications having increased data rates that require high precision synchronization clock generation. Such systems may use on-chip LC (inductor-capacitor) oscillators synchronized to an external reference (e.g. quartz or MEMS oscillator).

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
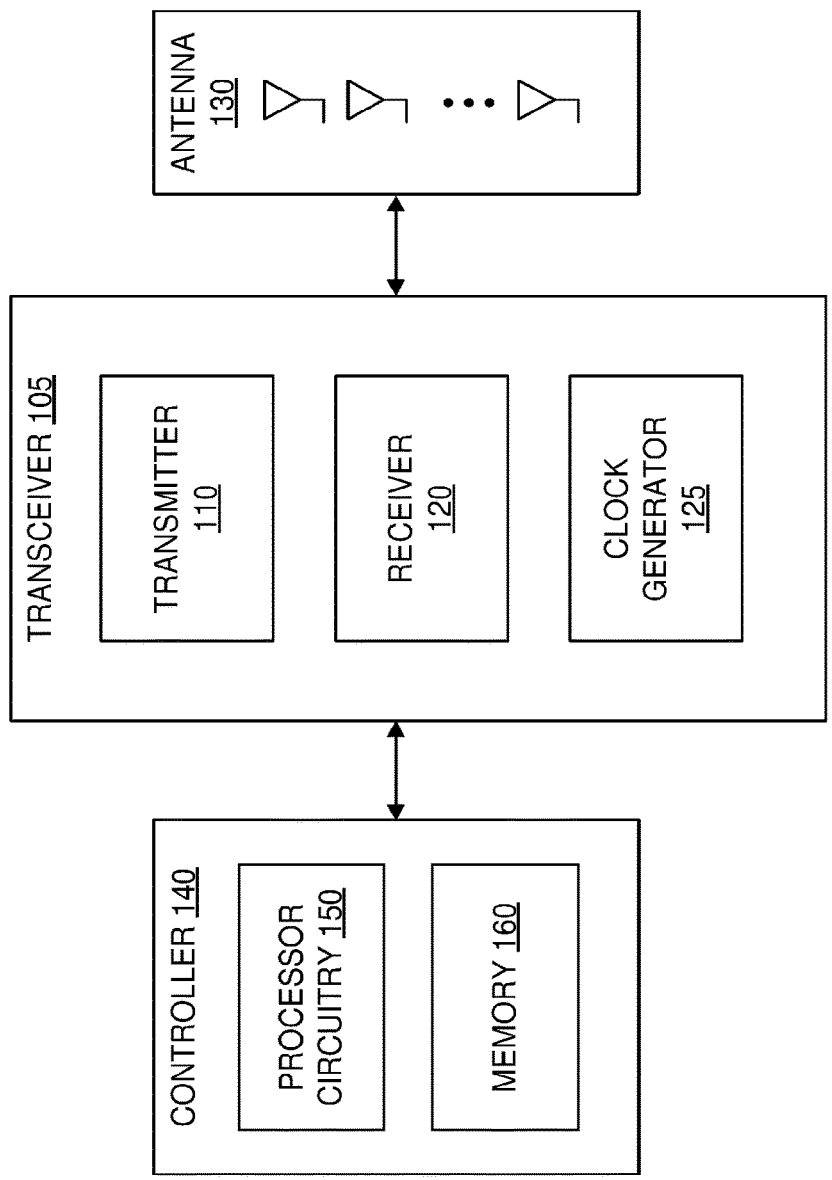
FIG. 1 illustrates a communication device according to an exemplary aspect of the present disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Aspects described herein generally relate to methods and systems for clock generation, including clock generation systems and methods including one or more Fin Field Effect Transistors (FinFETs) in a closed look configuration. A FinFET is a three-dimensional transistor and can include a channel that is raised above the plane of the silicon creating a "fin" structure.

Wireless communication devices may be configured for multiple radio access technologies (RATs). In these examples, the transceiver(s) of the communication device can be configured to perform carrier aggregation. In systems that include inductor-based oscillators, concurrent reception and transmission requirements may result in electro-magnetic coupling between concurrently oscillating oscillators (e.g. digitally controlled oscillators). Further, inductors generally do not scale with process technology and result in reduced production yield. Example RATs include (but are not limited to), 2G, 3G, 4G, LTE, 5G, satellite navigation technologies (e.g. GNSS), BT, WiFi, CDMA, or one or more other wireless technologies as would be understood by one of ordinary skill in the art.

Aspects of the present disclosure avoid the general requirements of on-chip inductor-based oscillators, including a high resistivity substrate (usually not used due to latch up problems) to achieve a very high Q to fulfil low phase noise specifications. Further, modelling of inductors in a deep submicron process is very complex and reduce the chance for the first-time right solution. Also, integrating numerous PLLs based on LC oscillator (e.g. synchronized to an external, high quality reference provided by a quartz or MEMS oscillator) may result in unwanted cross-talk between the oscillators due to magnetic and capacitive coupling.

The aspects herein are applicable to transmitters, receivers, and other electronic devices requiring one or more accurate clock generations as would be understood by one of ordinary skill in the art. Although aspects are described with respect to wireless communications, the present disclosure is not limited to wireless communication implementations and can include other applications that use clock generators and synchronizations using such generated clock(s), including, wired communications, data processing, encryption, or the like.

FIG. 1 illustrates a communication device 100 according to an exemplary aspect of the present disclosure. The communication device 100 is configured to transmit and/or receive wireless communications via one or more wireless technologies. For example, the communication device 100 can be configured for wireless communications conforming to, for example, one or more fifth generation (5G) "New Radio" cellular communication protocols, such as 5G protocols that use the 28 GHz frequency spectrum, communication protocols conforming to the Wireless Gigabit Alliance (WiGig) standard, such as IEEE 802.11ad and/or IEEE 802.11ay that use the 60 GHz frequency spectrum, or one or more other 5G or other radio access technologies as would be understood by one of ordinary skill in the art. That is, the communication device 100 is not limited to these communication protocols and can be configured for one or more additional or alternative wireless and/or wired communication protocols, such as one or more 3rd Generation Partnership Project's (3GPP) protocols (e.g., Long-Term Evolution (LTE)), one or more wireless local area networking (WLAN) communication protocols, and/or one or more other communication protocols as would be understood by one of ordinary skill in the relevant arts.

The communication device 100 can be configured to communicate with one or more other communication devices, including, for example, one or more base stations, one or more access points, one or more other communication devices, and/or one or more other devices as would be understood by one of ordinary skill in the relevant arts. Although the exemplary aspects of the communication device 100 are described with respect to wireless communications, the communication device 100 can be configured for one or more wired communication technologies as would be understood by one of ordinary skill in the relevant arts.

In an exemplary aspect, the communication device 100 includes a controller 140 communicatively coupled to one or more transceivers 105. The transceiver 105 is configured to transmit and/or receive wireless communications via one or more wireless technologies. In an exemplary aspect, the transceiver 105 includes processor circuitry that is configured for transmitting and/or receiving wireless communications conforming to one or more wireless protocols. In other aspects, additionally or alternatively, the transceiver 105 is configured to transmit and/or receive wired communications via one or more wired technologies. In an exemplary aspect, the processor circuitry of the transceiver 105 is configured for transmitting and/or receiving wired communications conforming to one or more wired protocols.

In an exemplary aspect, the transceiver 105 includes a transmitter 110 and a receiver 120 configured for transmitting and receiving wireless communications, respectively, via one or more antennas 130. In wired communication aspects, the transmitter 110 and the receiver 120 are configured for transmitting and receiving wired communications, respectively.

In aspects having two or more transceivers 105, the two or more transceivers 105 can have their own antenna 130, or can share a common antenna via a duplexer. In an exemplary aspect, the transceiver 105 (including the transmitter 110 and/or receiver 120) is configured to perform one or more baseband processing functions (e.g., media access control (MAC), encoding/decoding, modulation/demodulation, data symbol mapping; error correction, etc.).

In an exemplary aspect, the transceiver 105 additionally includes a clock generator 125 that is configured to generate one or more high precision synchronization clock signals. The clock signal(s) can be used by the transmitter 110, receiver 120, one or more other components of the transceiver 105, the controller 140, and/or one or more other components of the communication device 100. In an exemplary aspect, the clock generator 125 includes one or more FinFET oscillators as discussed in more detail below. In an exemplary aspect, the clock generator 125 includes processor circuitry that is configured to perform one or more operations and/or functions of the clock generator 125, including generating one or more clock signal(s).

The antenna 130 can be a single antenna, include multiple antennas, or include one or more antenna elements forming an integer array of antenna elements. In an exemplary aspect, the antenna 130 is a phased array antenna that includes multiple radiating elements (antenna elements) each having a corresponding phase shifter. The antenna 130 configured as a phased array antenna can be configured to perform one or more beamforming and/or beam-scanning operations. The beamforming operations can include generating beams formed by shifting the phase of the signal emitted from each radiating element to provide constructive/destructive interference so as to steer the beams in the desired direction.

In an exemplary aspect, the controller 140 includes processor circuitry 150 that is configured to control the overall operation of the communication device 100, such as the operation of the transceiver(s) 105. The processor circuitry 150 may be configured to control the transmitting and/or receiving of wireless communications via the transceiver(s) 105 and/or control phase shifting and/or amplifier gain values associated with antenna elements of the antenna 130.

In an exemplary aspect, the processor circuitry 150 is configured to perform one or more baseband processing functions (e.g., media access control (MAC), encoding/decoding, modulation/demodulation, data symbol mapping; error correction, etc.) in cooperation with the transceiver 105 or instead of such operations/functions being performed by the transceiver 105. The processor circuitry 150 is configured to run one or more applications and/or operating systems; power management (e.g., battery control and monitoring); display settings; volume control; and/or user interactions via one or more user interfaces (e.g., keyboard, touchscreen display, microphone, speaker, etc.) in one or more aspects.

In an exemplary aspect, the controller 140 further includes a memory 160 that stores data and/or instructions. When the instructions are executed by the processor circuitry 150, the processor circuitry 150 performs the associated functions described herein.

The memory 160 may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory 160 can be non-removable or removable, or a combination of both. The controller 140 can additionally or alternatively be configured to access an external memory to store data within, or retrieve data from, the external memory.

Examples of the communication device 100 include (but are not limited to) a mobile computing device (mobile device)—such as a laptop computer, a tablet computer, a mobile telephone or smartphone, a "phablet," a personal digital assistant (PDA), and mobile media player; a wearable computing device-such as a computerized wrist watch or "smart" watch, and computerized eyeglasses; and/or internet-of-things (IoT) device. In some aspects of the present disclosure, the communication device 100 may be a stationary communication device, including, for example, a stationary computing device-such as a personal computer (PC), a desktop computer, television, smart-home device, security device (e.g., electronic/smart lock), automated teller machine, a computerized kiosk, and/or an automotive/aeronautical/maritime in-dash computer terminal.

In one or more aspects, the communication device 100 or one or more components of the communication device 100 is additionally or alternatively configured to perform digital signal processing (e.g., using a digital signal processor (DSP)), modulation and/or demodulation (using a modulator/demodulator), a digital-to-analog conversion (DAC) and/or an analog-to-digital conversion (ADC) (using a respective DA and AD converter), an encoding/decoding (e.g., using encoders/decoders having convolution, tail-biting convolution, turbo, Viterbi, and/or Low Density Parity Check (LDPC) encoder/decoder functionality), frequency conversion (using, for example, mixers, local oscillators, and filters), Fast-Fourier Transform (FFT), preceding, and/or constellation mapping/de-mapping to transmit and/or receive wireless communications conforming to one or more wireless protocols and/or facilitate the beamforming scanning operations and/or beamforming communication operations.

Figure 2:
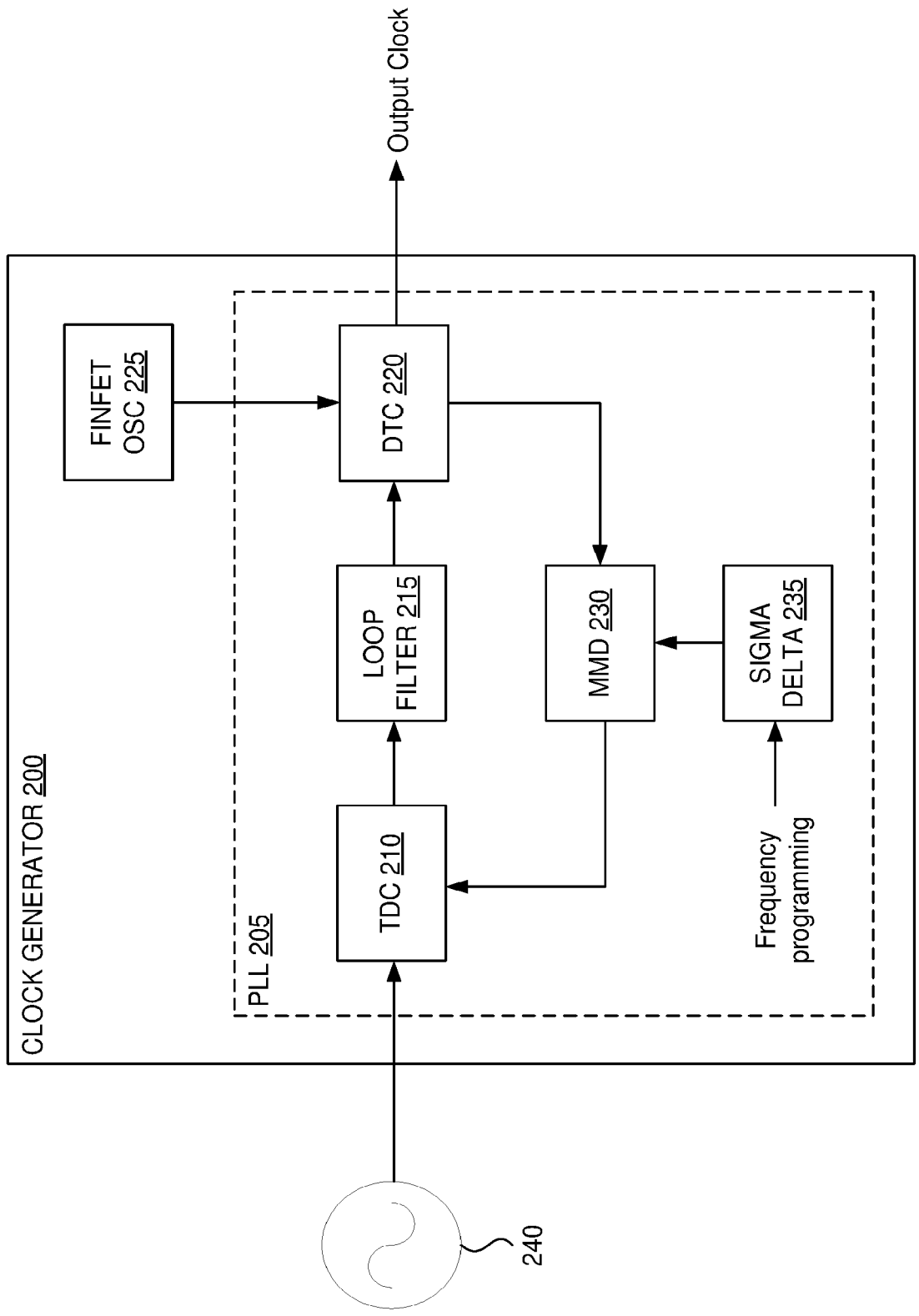
FIG. 2 illustrates a clock generator according to an exemplary aspect of the present disclosure.

FIG. 2 illustrates a clock generator according to an exemplary aspect of the present disclosure. The clock generator 200 can be implemented in the communication device 100 as clock generator 125 in one or more aspects.

In an exemplary aspect, the clock generator 200 includes a phased-lock loop (PLL) 205 and a Fin Field Effect Transistor (FinFET) oscillator 225. In an exemplary aspect, the PLL 205 includes a time-to-digital converter (TDC) 210, a loop filter 215, a digital-to-time converter (DTC) 220, multi-modulus divider (MMD) 230, and a sigma-delta modulator 235. In an exemplary aspect, one or more of the components of the PLL 205 and/or the FinFET oscillators 225 includes processor circuitry that is configured to perform one or more respective operations and/or functions of the PLL 205 and/or FinFET oscillator 225.

In an exemplary aspect, the TDC 210 is configured to: receive a reference clock signal generated by oscillator 240 (e.g. crystal oscillator) and a feedback signal from the MMD 230, compare the reference clock signal and the feedback signal, and generate a digital output signal based on the comparison of the reference clock signal and the feedback signal. In an exemplary aspect, the TDC 210 is configured to measure a time interval of the reference clock signal and/or the feedback signal, and convert the reference clock signal, the feedback signal, and/or a comparison of the reference clock and feedback signals into digital (e.g. binary) output. The digital output signal generated by the TDC 210 is then provided from the TDC 210 to the loop filter 215. In an exemplary aspect, the loop filter 215 is configured to filter the digital output signal and generate a filtered signal. Although the illustrated example shows the oscillator 240 being external to the clock generator 200, the oscillator 240 can be comprised within the clock generator 200 in one or more aspects. In an alternative aspect, the oscillator 240 is comprised within the controller 140, or within another component of the communication device 100.

Figure 5:
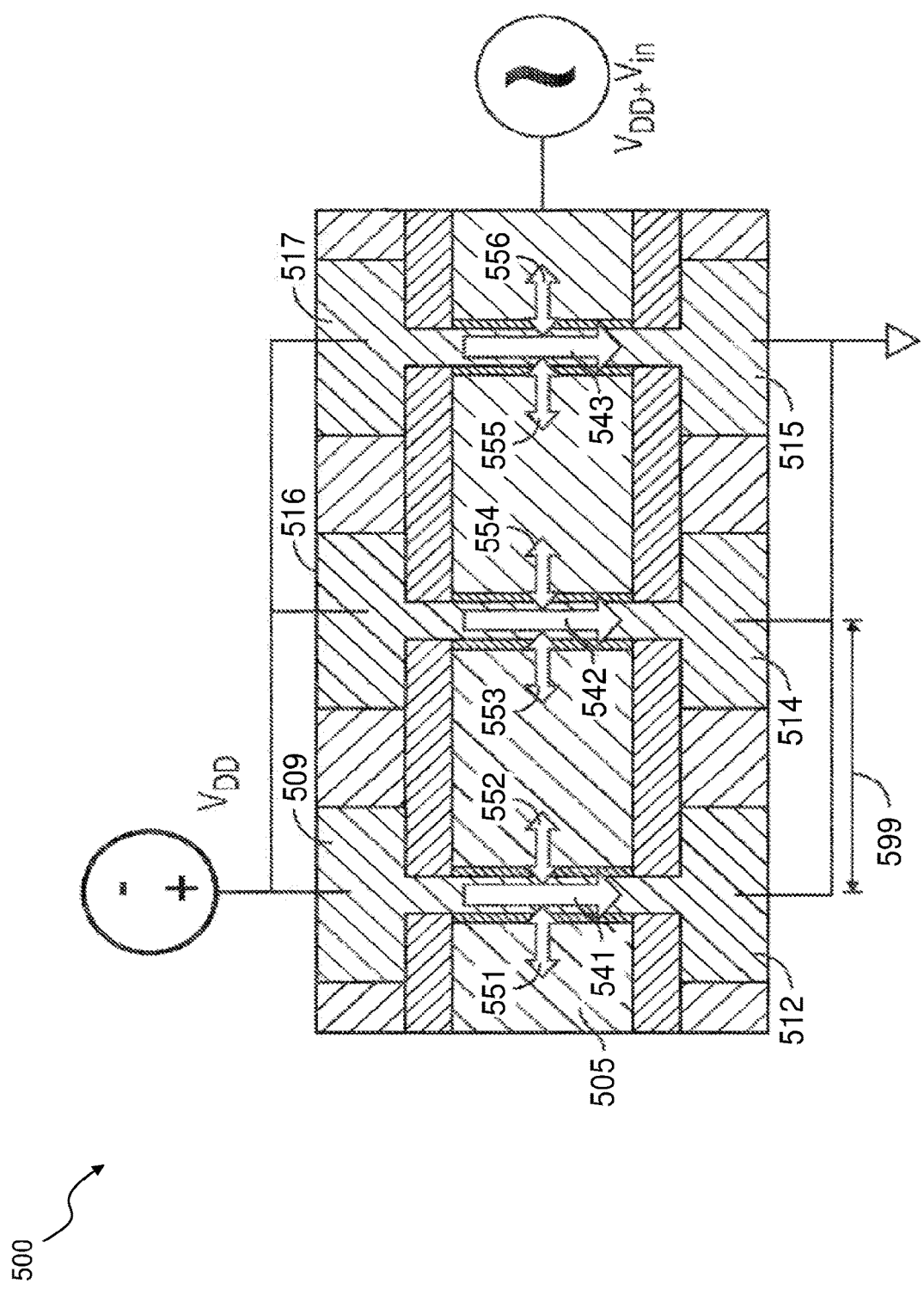
FIG. 5 illustrates a FinFET oscillator according to an exemplary aspect of the present disclosure.

In an exemplary aspect, the FinFET oscillator 225 is configured to generate one or more clock signals at one or more respective frequencies. In an exemplary aspect, the FinFET oscillator 225 is configured to generate a gigahertz clock signal, such as a clock signal in the range of 20-30 GHz. The FinFET oscillator 225 is not limited to generating clock signals in the range of 20-30 GHz, and can generate clock signals at other frequencies as would be understood by one of ordinary skill in the art. In an exemplary aspect, the FinFET oscillator 225 includes processor circuitry that is configured to perform one or more operations and/or functions of the FinFET oscillator 225, including generating an oscillating signal (e.g. a clock signal) having a particular frequency (e.g. 20-30 GHz). An example FinFET oscillator/resonator 500 is illustrated in FIG. 5. In an exemplary aspect, the FinFET oscillator 225 is implemented as the FinFET oscillator 500, but is not limited thereto. In an exemplary aspect, the FinFET oscillator 500 is a FinFET based resonator. In an exemplary aspect, the FinFET oscillator 500 includes a plurality of FinFETs.

With reference to FIG. 5, the FinFET oscillator/resonator 500 is illustrated as a one-dimensional (1D) model where the fins are assumed to be very tall. In an exemplary embodiment, the height of fin divided by its width is greater than 3.0 and includes ratios such as 3.5, 4.0, 4.5, 5.0, 5.5, or 6.0. In an exemplary embodiment, the FinFET oscillator/resonator 500 is a piezoresistive resonator.

For actuation, a DC input (V.sub.DD) is supplied to the drain components 509, 516, 517 during gate actuation 551, 552, 553, 554, 555, 556. In an alternative exemplary embodiment, V.sub.DD may be supplied to source components. Also, to generate gate actuation 551, 552, 553, 554, 555, 556 VAC is supplied to gate 505, along with V.sub.DD (V.sub.DD generates an inversion layer for the channel and also provides capacitance about the gate dielectric). In an exemplary embodiment, V.sub.in (e.g., 10 to 100 mV) and V.sub.DD (e.g., 0.7 to 1.2 V, depending on gate oxide thickness) excites the mechanical modes of the device. More specifically, the applied time varying voltage (DC+AC) on the gate produces a time varying force on the channel material, which leads to acoustic resonance of the gate, putting an AC strain on the channel section/fin.

In an exemplary embodiment, for sensing, V.sub.DD (0.7 to 1.2V) 541, 542, 543 is supplied to the source/drain components 509/512, 516/514, 517/515 and V.sub.DD (e.g., 0.7 to 1.2 V) is supplied to gate 505 to again generate an inversion layer for the channel and also provide channel inversion capacitance about the gate dielectric.

In an exemplary embodiment, the fin-to-fin pitch is 180 nm (measured as the distance between two adjacent fin channels) 599. In an exemplary embodiment, the fins are silicon fins, and gate 505 is a tungsten gate, but the disclosure is not limited thereto. In an exemplary embodiment, the f-Q product is $2 \times 10^{13}$ Hz with f and Q being the frequency and quality factor for the resonator device, respectively.

In an exemplary aspect, the DTC 220 is configured to receive the filtered signal from the loop filter 215 and the FinFET clock signal generated by the FinFET oscillator 225. In an exemplary aspect, the DTC 220 is configured to divide down (e.g. phase modulate) the FinFET clock signal based on the filtered signal to generate an output clock signal having a desired frequency (e.g. 500 MHz to 8 GHz, but is not limited thereto). In an exemplary aspect, the output clock signal has a frequency of 500 MHz to 5 GHz. In an exemplary aspect, the output clock signal has a frequency of 500 MHz to 8 GHz. The frequency of the output clock signal is not limited to these exemplary frequency values and can be other frequency values as would be understood by one of ordinary skill in the relevant arts.

In operation, the output clock signal can be fed back to the MMD 230. In an exemplary aspect, the MMD 230 is configured to divide the output clock signal from the DTC 220 by N to obtain a feedback signal. The feedback signal is then provided to the TDC 210. The MMD 230 can be adjusted (e.g. the value of N) based on a sigma delta signal generated by sigma delta modulator 235. This adjustment can be controlled by an external frequency programming signal. In an exemplary aspect, the MMD 230 is a frequency or fractional divider.

In an exemplary aspect, the output clock signal is locked and referenced to the common reference clock signal generated by the oscillator 240 and stabilized by the PLL 205. In this example, the DTC (and other DTCs in systems having multiple closed-loop DTC configurations), is synchronized to the reference clock signal of the oscillator 240 (e.g. 38.4 MHz).

Figure 3:
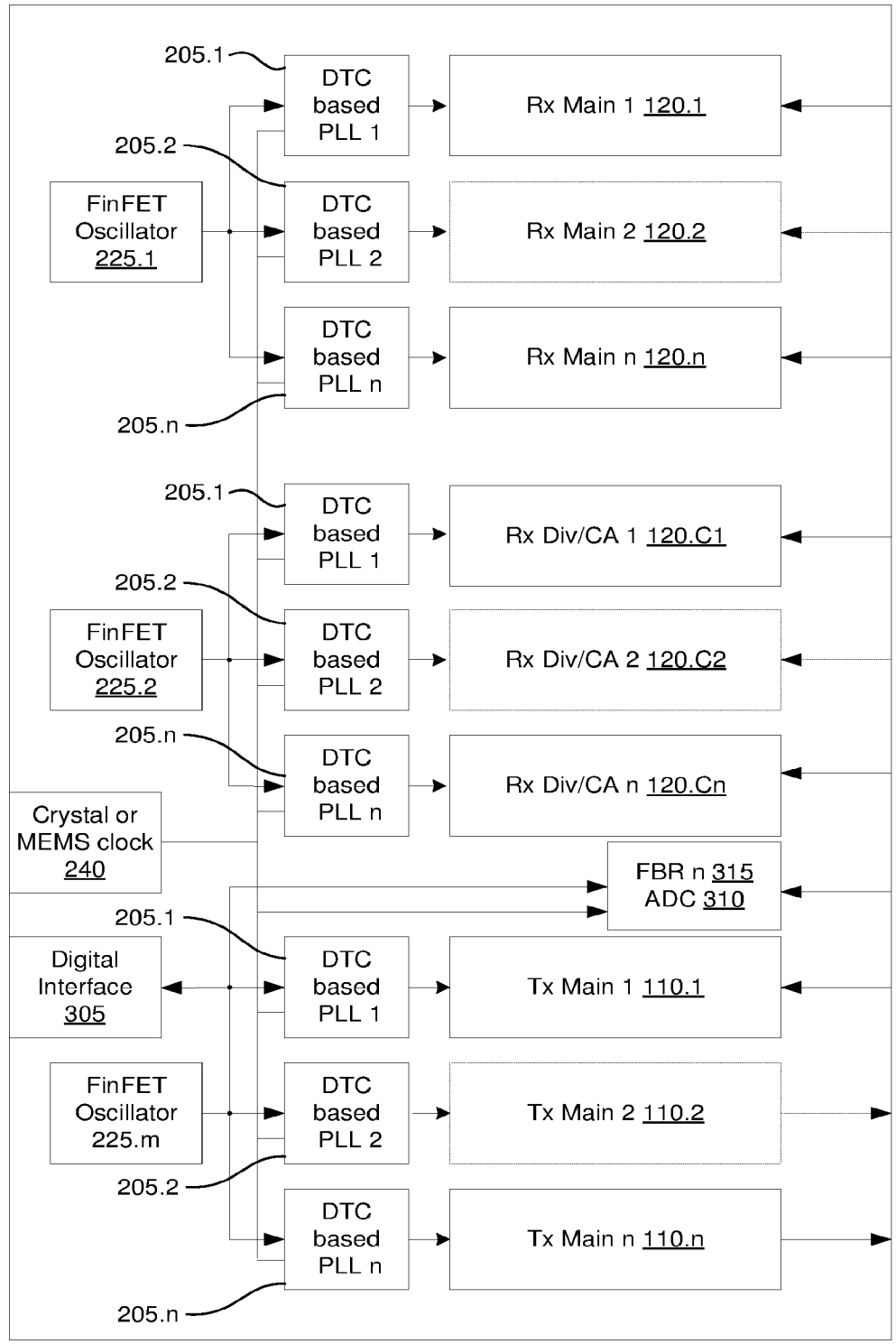
FIG. 3 illustrates a transceiver according to an exemplary aspect of the present disclosure.

FIG. 3 illustrates a transceiver 300, which is an exemplary aspect of the transceiver 105. In an exemplary aspect, the transceiver 300 includes one or more clock generators 200 having the FinFET oscillator 225. In exemplary aspect, as shown in FIG. 3, two or more DTCs 205 share a corresponding FinFET oscillator 225. In other aspects, each DTC 205 includes its own dedicated FinFET oscillator 225. In an alternative aspect, some DTCs 205 share a common FinFET oscillator 225 while one or more other DTCs 205 include their own FinFET oscillator 225.

For example, to optimize power consumption of the LO distribution, each group of receivers (e.g. main Rx 120.1-120.n and diversity Rx 120.C1-120.Cn,) and transmitters (e.g. main Tx 110.1-110.n) have a corresponding FinFET oscillator 225. Alternatively, the FinFET frequency can be derived from the only one FinFET oscillator 225 depending of chip size and application, or one or more DTCs 205 have a dedicated FinFET oscillator 225. The transceiver 300 can also include an analog-to-digital converter (ADC) 310, a digital interface 305, and a feedback receiver (FBR) 315. The transceiver 300 can also include one or more digital-to-analog converters (DACs. The ADC 310, digital interface 305, FBR 315, and/or DAC(s) can utilize a FinFET clock (e.g. output clock signal in FIG. 2) from a FinFET oscillator 225 (e.g. from an inductor less resonator).

Figure 4:
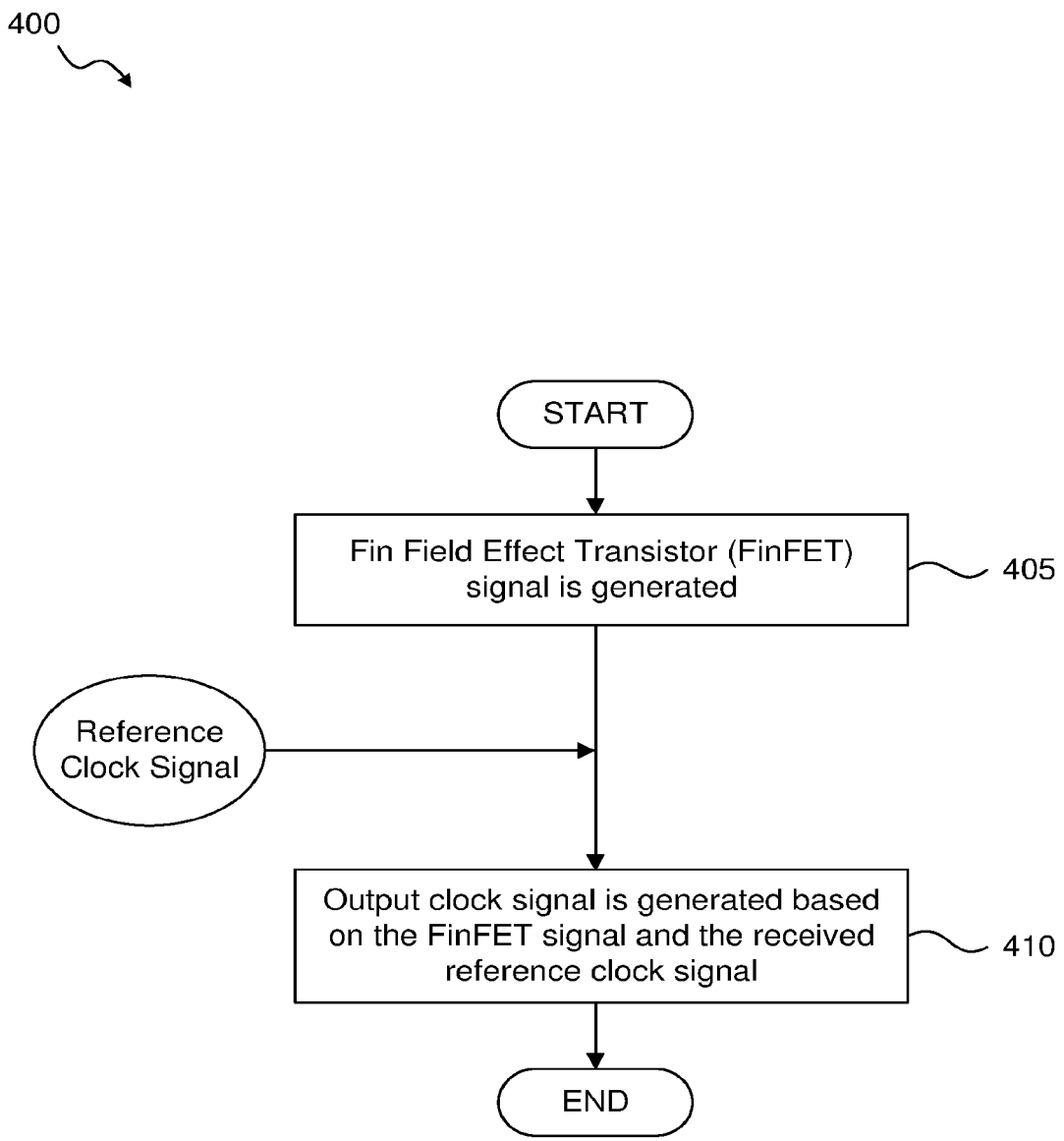
FIG. 4 illustrates a flowchart 400 of a clock generation method according to an exemplary aspect of the present disclosure.

FIG. 4 illustrates a flowchart 400 of a clock generating method according to an exemplary aspect of the present disclosure. The flowchart 400 is discussed with reference to FIGS. 1-3 and 5.

The flowchart 400 begins at operation 405, where a Fin Field Effect Transistor (FinFET) signal is generated. In an exemplary aspect, the FinFET signal is generated by a FinFET oscillator, such as FinFET oscillator 225. The FinFET oscillator can be a component of a clock generator, such as clock generator 200.

After operation 405, the flowchart 400 transitions to operation 410, where an output clock signal is generated based on the FinFET signal and a received reference clock signal. In an exemplary aspect, the output clock signal is generated by a phased-locked loop (PLL), such as PLL 205. In an exemplary aspect, the FinFET signal is modulated based on the reference clock signal. The reference clock signal may be generated by a reference clock generator, such as an oscillator 240 (e.g. crystal oscillator).

EXAMPLES

Example 1 is a clock generator comprising: a Fin Field Effect Transistor (FinFET) oscillator configured to generate a FinFET signal; and a phased-locked loop (PLL) configured to generate an output clock signal based on a reference clock signal and the FinFET signal.

Example 2 is the subject matter of Example 1, wherein the PLL comprises: a time-to-digital converter (TDC) is configured to generate a digital output signal based on the reference clock signal and a feedback signal; a loop filter configured to filter the digital output signal to generate a filtered signal; a digital-to-time converter (DTC) configured to generate the output clock signal based on the filtered signal and the FinFET signal; and multi-modulus divider (MMD) that is configured to generate the feedback signal based on the output clock signal.

Example 3 is the subject matter of any of Examples 1-2, wherein the FinFET oscillator is configured to generate the FinFET signal having a frequency ranging from 20 GHz to 30 GHz.

Example 4 is the subject matter of any of Examples 1-3, wherein the reference clock signal is generated by a crystal oscillator.

Example 5 is the subject matter of any of Examples 1-4, wherein the FinFET oscillator is an inductor-less oscillator.

Example 6 is the subject matter of any of Examples 1-5, wherein output clock signal has a frequency ranging from 500 MHz to 8 GHz.

Example 7 is the subject matter of any of Examples 1-6, wherein the DTC is configured to generate the output clock signal having a frequency ranging from 500 MHz to 8 GHz based on the filtered signal and the FinFET signal.

Example 8 is the subject matter of any of Examples 2-7, wherein the DTC is configured to adjust the FinFET signal based on the filtered signal to generate an output clock signal.

Example 9 is the subject matter of any of Examples 2-8, wherein the DTC is configured to phase modulate the FinFET signal based on the filtered signal to generate an output clock signal.

Example 10 is the subject matter of any of Examples 2-9, wherein the DTC is configured to divide the FinFET signal based on the filtered signal to generate an output clock signal.

Example 11 is the subject matter of any of Examples 1-10, wherein the FinFET signal is a clock signal generated by the FinFET oscillator.

Example 12 is a communication device comprising: a communication interface; and transceiver configured to process one or more communication signals transmitted or received via the communication interface, the transceiver including: a Fin Field Effect Transistor (FinFET) oscillator configured to generate a FinFET signal; and a phased-locked loop (PLL) configured to generate an output clock signal based on a reference clock signal and the FinFET signal.

Example 13 is the subject matter of Example 12, wherein the transceiver is configured to process the one or more communication signals based on the output clock signal.

Example 14 is the subject matter of any of Examples 12-13, wherein the communication interface is configured to communicatively couple to an antenna.

Example 15 is the subject matter of any of Examples 12-14, wherein the PLL comprises: a time-to-digital converter (TDC) is configured to generate a digital output signal based on the reference clock signal and a feedback signal; a loop filter configured to filter the digital output signal to generate a filtered signal; a digital-to-time converter (DTC) configured to generate the output clock signal based on the filtered signal and the FinFET signal; and multi-modulus divider (MMD) that is configured to generate the feedback signal based on the output clock signal.

Example 16 is the subject matter of any of Examples 12-15, wherein the FinFET oscillator is configured to generate the FinFET signal having a frequency ranging from 20 GHz to 30 GHz.

Example 17 is the subject matter of any of Examples 12-16, further comprising a crystal oscillator, wherein the reference clock signal is generated by the crystal oscillator.

Example 18 is the subject matter of any of Examples 12-16, wherein the transceiver further comprises a crystal oscillator, the reference clock signal being generated by the crystal oscillator.

Example 19 is the subject matter of any of Examples 12-16, wherein the reference clock signal is generated by a crystal oscillator.

Example 20 is the subject matter of any of Examples 12-19, wherein the FinFET oscillator is an inductor-less oscillator.

Example 21 is the subject matter of any of Examples 12-20, wherein output clock signal has a frequency ranging from 500 MHz to 8 GHz.

Example 22 is the subject matter of any of Examples 15-21, wherein the DTC is configured to generate the output clock signal having a frequency ranging from 500 MHz to 8 GHz based on the filtered signal and the FinFET signal.

Example 23 is the subject matter of any of Examples 15-22, wherein the DTC is configured to adjust the FinFET signal based on the filtered signal to generate an output clock signal.

Example 24 is the subject matter of any of Examples 15-23, wherein the DTC is configured to phase modulate the FinFET signal based on the filtered signal to generate an output clock signal.

Example 25 is the subject matter of any of Examples 15-24, wherein the DTC is configured to divide the FinFET signal based on the filtered signal to generate an output clock signal.

Example 26 is the subject matter of any of Examples 12-25, wherein the FinFET signal is a clock signal generated by the FinFET oscillator.

Example 27 is a method to generate a clock signal, comprising: generating, by a Fin Field Effect Transistor (FinFET) oscillator, a FinFET signal; and generating, by a phased-locked loop (PLL), an output clock signal based on the FinFET signal and a reference clock signal.

Example 28 is the subject matter of Example 27, wherein generating the output signal comprises modulating the FinFET clock signal based on the filtered signal.

Example 29 is the subject matter of any of Examples 27-28, further comprising generating the reference clock signal.

Example 30 is the subject matter of Example 29, wherein the reference clock signal is generated by a crystal oscillator.

Example 31 is a non-transitory computer-readable storage medium with an executable program stored thereon, that when executed, instructs a processor to perform the method of any of Examples 27-30.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. For example, a circuit includes an analog circuit, a digital circuit, state machine logic, data processing circuit, a programmable processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to communication protocols that utilize the millimeter wave (mmWave) spectrum (e.g., 24 GHz-300 GHz), such as WiGig (IEEE 802.1 lad and/or IEEE 802.11ay) which operates at 60 GHz, and/or one or more 5G protocols using, for example, the 28 GHz frequency spectrum. The exemplary aspects can be applied to other wireless communication protocols/standards (e.g., LTE or other cellular protocols, other IEEE 802.11 protocols, etc.) as would be understood by one of ordinary skill in the relevant arts.

What is claimed is:

1. A clock generator comprising:
a Fin Field Effect Transistor (FinFET) oscillator configured to generate a FinFET signal by producing a time varying force on a channel of a FinFET that includes a fin structure in response to a time varying voltage applied to a gate of the FinFET; and
a phased-locked loop (PLL) configured to generate an output clock signal based on a reference clock signal and the FinFET signal.

2. The clock generator of claim 1, wherein the channel that comprises a ratio of a height divided by a width that is greater than three.

3. The clock generator of claim 1, wherein the output clock signal has a frequency ranging from 500 MHz to 8 GHz.

4. The clock generator of claim 1, wherein the PLL comprises:
a time-to-digital converter (TDC) is configured to generate a digital output signal based on the reference clock signal and a feedback signal;
a loop filter configured to filter the digital output signal to generate a filtered signal;
a digital-to-time converter (DTC) configured to generate the output clock signal based on the filtered signal and the FinFET signal, wherein the DTC is synchronized to the reference clock signal; and
multi-modulus divider (MMD) that is configured to generate the feedback signal based on the output clock signal.

5. The clock generator of claim 4, wherein the DTC is configured to generate the output clock signal having a frequency ranging from 500 MHz to 8 GHz based on the filtered signal and the FinFET signal.

6. The clock generator of claim 4, wherein the DTC is configured to adjust the FinFET signal of the FinFET oscillator based on the filtered signal of the loop filter to generate the output clock signal.

7. The clock generator of claim 4, wherein the DTC is configured to phase modulate the FinFET signal of the FinFET oscillator based on the filtered signal of the loop filter to generate the output clock signal.

8. The clock generator of claim 4, wherein the DTC is configured to divide the FinFET signal of the FinFET oscillator based on the filtered signal of the loop filter to generate the output clock signal.

9. A communication device comprising:
a communication interface; and
transceiver configured to process one or more communication signals transmitted or received via the communication interface, the transceiver including:
a Fin Field Effect Transistor (FinFET) oscillator configured to generate a FinFET signal, wherein the FinFET oscillator comprises a FinFET that includes a fin structure comprising a channel, wherein the FinFET is configured to produce a time varying force on the channel in response to a time varying voltage applied to a gate of the FinFET; and
a phased-locked loop (PLL) configured to generate an output clock signal based on a reference clock signal and the FinFET signal.

10. The communication device of claim 9, wherein the transceiver is configured to process the one or more communication signals based on the output clock signal.

11. The communication device of claim 9, wherein the FinFET oscillator is configured to generate the FinFET signal having a frequency ranging from 20 GHz to 30 GHz.

12. The communication device of claim 9, wherein the FinFET oscillator is an inductor-less oscillator.

13. The communication device of claim 9, wherein the output clock signal has a frequency ranging from 500 MHz to 8 GHz.

14. The communication device of claim 9, wherein the PLL comprises:
a time-to-digital converter (TOO) is configured to generate a digital output signal based on the reference clock signal and a feedback signal;
a loop filter configured to filter the digital output signal to generate a filtered signal;
a digital-to-time converter (DTC) configured to generate the output clock signal based on the filtered signal and the FinFET signal, wherein the DTC is synchronized to the reference clock signal; and
multi-modulus divider (MMD) that is configured to generate the feedback signal based on the output clock signal.

15. The communication device of claim 14, wherein the DTC is configured to generate the output clock signal having a frequency ranging from 500 MHz to 8 GHz based on the filtered signal and the FinFET signal.

16. The communication device of claim 14, wherein the DTC is configured to adjust the FinFET signal of the FinFET oscillator based on the filtered signal of the loop filter to generate the output clock signal.

17. The communication device of claim 14, wherein the DTC is configured to phase modulate the FinFET signal of the FinFET oscillator based on the filtered signal of the loop filter to generate the output clock signal.

18. The communication device of claim 14, wherein the DTC is configured to divide the FinFET signal of the FinFET oscillator based on the filtered signal of the loop filter to generate the output clock signal.

19. A method to generate a clock signal, comprising:
generating, by a Fin Field Effect Transistor (FinFET) oscillator, a FinFET signal by producing a time varying force on a channel of a FinFET including a fin structure in response to a time varying voltage applied to a gate of the FinFET; and
generating, by a phased-locked loop (PLL), an output clock signal based on the FinFET signal and a reference clock signal.

20. The method of claim 19, wherein generating the output clock signal comprises modulating the FinFET signal based on a filtered signal.

* * * * *